(12) United States Patent
Ishikawa et al.

(10) Patent No.: US 10,636,762 B2
(45) Date of Patent: Apr. 28, 2020

(54) METHOD OF MANUFACTURING SEMICONDUCTOR DEVICE

(71) Applicant: Panasonic Intellectual Property Management Co., Ltd., Osaka (JP)

(72) Inventors: Takatoshi Ishikawa, Fukuoka (JP); Teppei Kojio, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/040,617

(22) Filed: Jul. 20, 2018

(65) Prior Publication Data
US 2019/0035762 A1    Jan. 31, 2019

(30) Foreign Application Priority Data
Jul. 27, 2017    (JP) ................................ 2017-145077

(51) Int. Cl.
*H01L 23/00*    (2006.01)
*H01L 21/67*    (2006.01)

(52) U.S. Cl.
CPC ........ *H01L 24/73* (2013.01); *H01L 21/67144* (2013.01); *H01L 24/81* (2013.01); *H01L 24/83* (2013.01); *H01L 24/92* (2013.01); *H01L 24/29* (2013.01); *H01L 2224/13101* (2013.01); *H01L 2224/13147* (2013.01); *H01L 2224/16225* (2013.01); *H01L 2224/2929* (2013.01); *H01L 2224/29386* (2013.01); *H01L 2224/32225* (2013.01); *H01L 2224/73104* (2013.01); *H01L 2224/73204* (2013.01); *H01L 2224/75* (2013.01); *H01L 2224/7565* (2013.01); *H01L 2224/81011* (2013.01);
(Continued)

(58) Field of Classification Search
CPC ... H01L 24/79; H01L 21/67144; H01L 24/81; H01L 24/83; H01L 24/29; H01L 2224/13101; H01L 2224/13147; H01L 2224/16225; H01L 2224/2929; H01L 2224/29386
See application file for complete search history.

(56) References Cited

U.S. PATENT DOCUMENTS

2002/0132463 A1*  9/2002  Urushima ............. H01L 21/563
                                                    438/613
2005/0001014 A1   1/2005  Takeuchi et al.
(Continued)

FOREIGN PATENT DOCUMENTS

JP    2005-026579    1/2005

*Primary Examiner* — Zandra V Smith
*Assistant Examiner* — Andre C Stevenson
(74) *Attorney, Agent, or Firm* — Pearne & Gordon LLP

(57) ABSTRACT

A method of manufacturing a semiconductor device includes a step of preparing a semiconductor element including a functional surface on which a bump is formed and an adhesive layer of a film shape including a flux component, a step of positioning the semiconductor element above a board including an electrode, a step of activating a flux component by applying ultrasonic vibration to the semiconductor element, a step of bringing the bump into contact with the electrode by pressing the semiconductor element to the board, and a step of bonding the bump to the electrode by continuing the application of the ultrasonic vibration and the pressing of the semiconductor element.

3 Claims, 5 Drawing Sheets

(52) U.S. Cl.
CPC .......... *H01L 2224/81205* (2013.01); *H01L 2224/81801* (2013.01); *H01L 2224/81815* (2013.01); *H01L 2224/83024* (2013.01); *H01L 2224/8388* (2013.01); *H01L 2224/83191* (2013.01); *H01L 2224/83205* (2013.01); *H01L 2224/83855* (2013.01)

(56) References Cited

U.S. PATENT DOCUMENTS

2007/0023777 A1* 2/2007 Sonobe ................ H01L 33/40
 257/103
2016/0351432 A1* 12/2016 Takamoto .......... H01L 21/6836

* cited by examiner

US 10,636,762 B2

METHOD OF MANUFACTURING SEMICONDUCTOR DEVICE

BACKGROUND

1. Technical Field

The present disclosure relates to a method of manufacturing a semiconductor device in which a bump of the semiconductor element is bonded to an electrode of a board.

2. Description of the Related Art

In a manufacturing process of the semiconductor device, by bonding a bump for external connection formed on a semiconductor element to an electrode of a board, a semiconductor element is mounted on the board. In a semiconductor device of such a configuration, for the purpose of fixing the semiconductor element and the board and reinforcing a junction portion between a bump and the electrode, a gap between the semiconductor element and the board is sealed with resin. As a component mounting method for a semiconductor element in manufacturing such a semiconductor device, there is known a technology in which a liquid resin for resin sealing is coated on the board so as to cover the electrode and the bump of the semiconductor element is bonded to the electrode by ultrasonic bonding via a liquid resin (for example, see Japanese Patent Unexamined Publication No. 2005-26579).

In the related art described in the Japanese Patent Unexamined Publication No. 2005-26579, a liquid flux fill having both the act of flux and a function as underfill resin is coated on the board of a surface on which an electrode is formed. In this state, solder bumps formed on the electronic component and the electrodes are ultrasonically bonded. In this process, the solder bump is brought close to the electrode covered with the flux fill and the solder bump comes into contact with the electrode such that ultrasonic vibration energy acts to a contact portion between the solder bump and the electrode.

SUMMARY

A method of manufacturing a semiconductor device of the present disclosure includes a first step of preparing a semiconductor element including a functional surface on which a bump for external connection is formed and an adhesive layer of a film shape that covers the functional surface and the bump, and includes a flux component; a second step of positioning the semiconductor element in a state in which the bump and an electrode face each other above a board including the electrode to which the bump is bonded; a third step of activating the flux component of a portion of the adhesive layer sandwiched between the bump and the electrode by pressing the adhesive layer against the electrode and applying ultrasonic vibration to the semiconductor element; a fourth step of pushing out the flux component from the portion of the adhesive layer by pressing the semiconductor element while applying the ultrasonic vibration to the board and bringing the bump into contact with the electrode; and a fifth step of bonding the bump to the electrode by continuing the application of the ultrasonic vibration and the pressing of the semiconductor element.

According to the present disclosure, it is possible to efficiently perform bonding of the bump and the electrode at a low temperature range by improving the act of removing an oxide film at a contact portion between the bump of the semiconductor element and the electrode of the board.

DETAILED DESCRIPTION

Prior to describing an embodiment, a problem in the related art will be briefly described.

The above-described related art has the following disadvantages due to the application of ultrasonic wave in a state where a solder bump is in contact with an electrode. That is, in the related art, when the ultrasonic waves are applied, most of flux fills are excluded from a contact portion between the solder bump and the electrode. Therefore, the removal of an oxide film by flux components with respect to a surface of the solder bump and the electrode does not sufficiently act, and bonding failure between the solder bump and the electrode is caused.

As a countermeasure against such a problem, it may be considered to increase oxide film removing act by activating the flux fill by heating. However, in this case, a problem such as warp deformation due to heating of the electronic component of a bonding target occurs. Particularly, in a case where a manufactured target is a stacked type semiconductor device mounted by stacking thin semiconductor elements, in order to suppress deformation due to heat as much as possible, it is required to be able to perform ultrasonic bonding in a temperature range as low as possible.

In view of the above, the present disclosure is to provide a method of manufacturing a semiconductor device capable of efficiently performing bonding of the bump and the electrode at a low temperature range by improving the act of removing an oxide film at a contact portion between the bump of the semiconductor element and an electrode of a board.

Next, an embodiment of the present disclosure will be described with reference to the drawings. First, with reference to FIG. 1, a configuration of bonding device 1 used in manufacturing of the semiconductor device of the present embodiment will be described. Bonding device 1 has a function of bonding the semiconductor element to a board by the ultrasonic bonding in manufacturing of the semiconductor device in which the bump of the semiconductor element is bonded to the electrode of the board.

Figure 1:
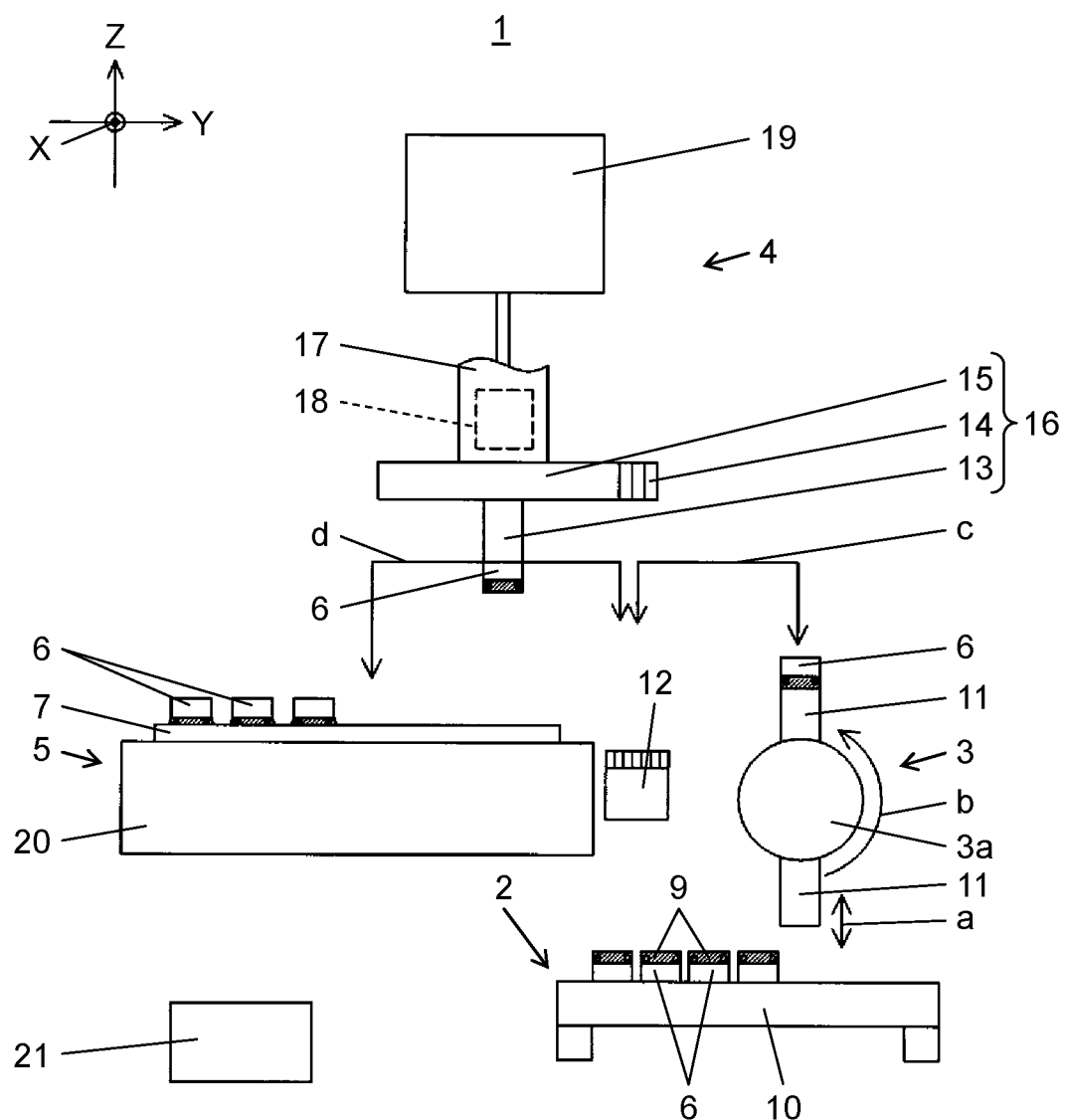
FIG. 1 is a configuration explanatory diagram of a bonding device used in a method of manufacturing a semiconductor device according to an embodiment of the present disclosure.

In FIG. 1, bonding device 1 includes element supplier 2, element inverter 3, bonding mechanism 4, and board positioner 5. In a bonding operation by bonding device 1, semiconductor elements 6 extracted from element supplier 2 are transferred to bonding mechanism 4 via element inverter 3. Bonding mechanism 4 causes semiconductor element 6 to be bonded to board 7 held in board positioner 5 by the ultrasonic bonding.

Element holding table 10 capable of horizontally moving in X direction and Y direction by a horizontal moving mechanism (not shown) is provided in element supplier 2. A plurality of semiconductor elements 6 which are a target of the bonding in this embodiment are held on an upper surface of element holding table 10. Here, semiconductor elements 6 are held in a face-up posture in which functional surface 6a on which adhesive layer 9 is provided faces upward. Semiconductor elements 6 are supplied to element supplier 2 in a state of being diced from a wafer. As a supply form of semiconductor element 6, a component container such as a tray in which the plurality of semiconductor elements 6 are stored in a regular array may be used.

Figure 2:
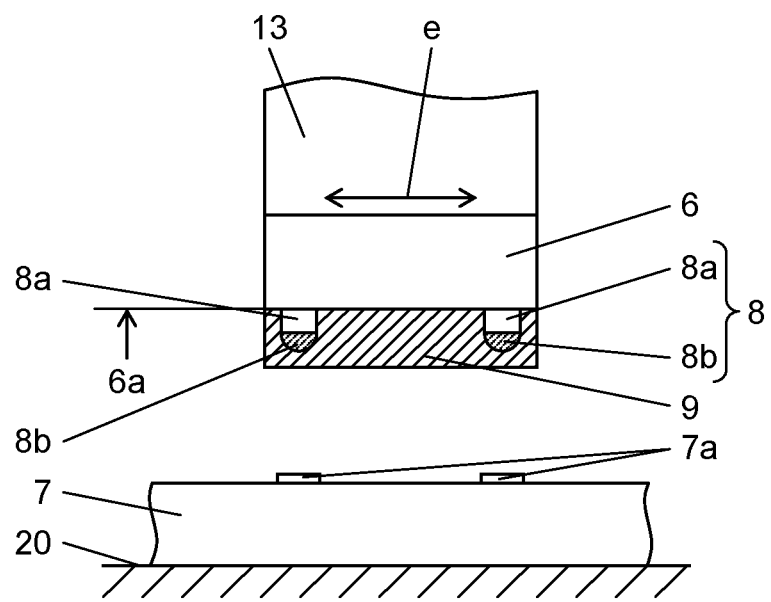
FIG. 2 is a sectional view of the semiconductor element used in the method of manufacturing the semiconductor device according to the embodiment of the present disclosure.

Here, a configuration of semiconductor element 6 will be described with reference to FIG. 2. In FIG. 2, a lower surface of semiconductor element 6 is functional surface 6a on which bump 8 for external connection is formed. Film shape adhesive layer 9 including flux components is provided on functional surface 6a so as to cover bump 8. That is, in this embodiment, semiconductor element 6 of adhesive layer 9 of which film shape adhesive layer 9 including the flux components covers functional surface 6a is used as a work target.

Here, bump 8 has a configuration in which solder 8b for bonding is formed on a tip end face of bump base portion 8a which is a projection electrode made of a conductive metal such as copper. Bump base portion 8a is formed to be electrically connected to circuit electrode 6b formed on functional surface 6a of semiconductor element 6. In addition, functional surface 6a around circuit electrode 6b is coated by insulating film 6c (see FIG. 3A and FIG. 3B). In this embodiment, solder 8b of bump 8 is bonded to electrode 7a made of a conductive metal such as copper formed on an upper surface of board 7 by the ultrasonic bonding.

In functional surface 6a, adhesive layer 9 covering bump 8 has a function as a flux removing the oxide film present in an upper surface of electrode 7a and lower surface of solder 8b which are junction portions in the ultrasonic bonding of bump 8 to electrode 7a of board 7. Furthermore, adhesive layer 9 also has a function as a sealing resin for sealing a gap between semiconductor element 6 and board 7 by curing after mounting by the ultrasonic bonding on board 7 of semiconductor element 6.

In order to achieve such a function, adhesive layer 9 has a composition including a main agent made of a resin, a thermoplastic agent, a curing agent for the resin, a curing accelerator, an organic acid, and a filler. The main agent, a thermosetting resin such as an epoxy resin is used. As a thermoplastic agent blended for forming a film, a phenoxy resin is used. As a curing agent for curing the resin, hydrazides, imidazoles, acid anhydrides or the like is used.

In addition, as a curing accelerator for accelerating the curing of the resin, imidazole is used. Furthermore, as the organic acid which is the flux component that reduces and removes the oxide film at the junction portion, succinic acid, benzoic acid, adipic acid, salicylic acid or the like is used. As a filler for adjusting thermal expansion of cured adhesive layer 9, silica, alumina or the like is used. Substance types shown in the above composition are examples and other kinds of substances having the same act can also be used.

Semiconductor elements 6 of the above-described structure are arranged on the upper surface of element holding table 10 in the face-up posture in which adhesive layer 9 faces upward in element supplier 2. These semiconductor elements 6 are sequentially extracted by element inverter 3, and transferred to bonding mechanism 4 after adhesive layer 9 is reversed to the downward in a face-down posture. As shown in FIG. 1, element inverter 3 includes a plurality (here, two) of pickup nozzles 11 extending radially from reverse mechanism 3a.

By upwardly moving pickup nozzle 11 positioned downward with respect to element holding table 10 (arrow a), semiconductor element 6 held in element holding table 10 in the face-up posture can be extracted by being suck and held by pickup nozzle 11. Next, by driving reverse mechanism 3a to pivot pickup nozzle 11 upward (arrow b), extracted semiconductor element 6 is positioned at a transfer position to bonding mechanism 4 in a state reversed to the face-down attitude.

Bonding mechanism 4 has a configuration in which bonding head 16 that performs the ultrasonic bonding by holding semiconductor element 6 moves in a horizontal direction and a vertical direction by bonding head movement mechanism 19. Camera 12 is disposed below a movement path of bonding head 16 by bonding head moving mechanism 19 with an imaging direction facing upward. Camera 12 images semiconductor element 6 held by holding nozzle 13 from below. By performing a recognition process on the imaged result by controller 21, true/false identification and a positional deviation state of semiconductor element 6 are detected.

Bonding head 16 is configured by mounting vibrator 14 on one end portion of ultrasonic horn 15. Furthermore, bonding head 16 has holding nozzle 13 holding semiconductor element 6. Holding nozzle 13 is provided to extend downward from ultrasonic horn 15. By operating vibrator 14, the ultrasonic vibration is transferred to holding nozzle 13 via ultrasonic horn 15. Bonding head 16 is connected to bonding head movement mechanism 19 via head holder 17 and pressing mechanism 18 is incorporated in head holder 17. Pressing mechanism 18 has a load control function for controlling a pressing load when pressing semiconductor element 6 against board 7 by bonding head 16 and a contact detection function for detecting a timing at which semiconductor element 6 is in contact with board 7 in a bonding process.

Board stage 20 for holding board 7 is provided on board positioner 5. In the bonding operation by bonding mechanism 4, the semiconductor elements 6 held by holding nozzle 13 are bonded on a plurality of the junction portions set on board 7 by sequentially ultrasonic bonding. In the bonding operation, vibrator 14 is operated while bump 8 of semiconductor element 6 held by holding nozzle 13 is pressed against electrode 7a of board 7 by a function of pressing mechanism 18 (see FIG. 2). The ultrasonic vibration is applied to semiconductor element 6 via ultrasonic horn 15 and holding nozzle 13 (see arrow e shown in FIG. 2). In this embodiment, a timing at which adhesive layer 9 is brought into contact with board 7 is detected by the contact detection function of pressing mechanism 18, and the application of the ultrasonic vibration starts using this timing as a trigger.

The bonding device 1 includes controller 21 and controller 21 in the above-described configuration controls operations of element supplier 2, element inverter 3, bonding mechanism 4, and board positioner 5. In this operation control, controller 21 performs positioning with respect to board 7 of semiconductor element 6 at the time of the bonding operation by controlling bonding mechanism 4 by adding a position recognition result of semiconductor element 6 acquired by camera 12.

In the bonding operation by bonding mechanism 4, first, bonding head 16 is moved above element inverter 3 by bonding head movement mechanism 19. Holding nozzle 13 is positioned above a transfer position of semiconductor element 6 by pickup nozzle 11. Next, bonding head 16 is lowered such that semiconductor element 6 of the face-down posture is sucked and held by holding nozzle 13. Next, by moving bonding head 16 above camera 12, semiconductor element 6 held by holding nozzle 13 is imaged by camera 12 (arrow c), and position recognition of semiconductor element 6 is performed.

Next, bonding head 16 holding semiconductor element 6 after position recognition is moved above board 7 held on board stage 20 in board positioner 5, and semiconductor element 6 of the face-down posture is lowered to a predetermined bonding portion (arrow d). That is, as shown in FIG. 2, bump 8 formed on functional surface 6a of semiconductor element 6 is positioned with respect to electrode 7a of board 7. Thereafter, bump 8 is bonded to electrode 7a of board 7 via solder 8b by an ultrasonic bonding process, which will be described in detail below.

Next, with reference to FIG. 3A to FIG. 4B, a manufacturing method in which the semiconductor device by the ultrasonic bonding on semiconductor element 6 of the above-described configuration on board 7 is manufactured, will be described. In FIG. 3A to FIG. 4B, semiconductor element 6, a pair of bumps 8 which is the bonding target in board 7, and electrode 7a are locally extracted and shown, and the description of holding nozzle 13 holding semiconductor element 6 is omitted.

Figure 3A:
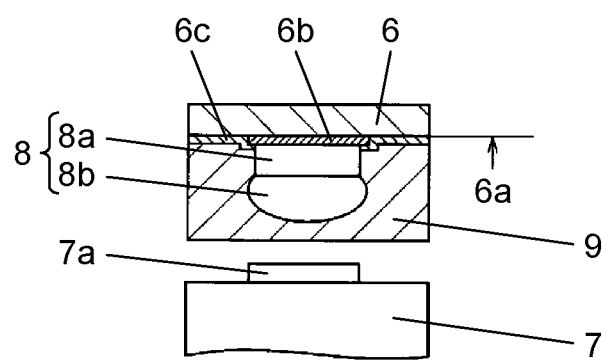
FIG. 3A is a process explanatory diagram of a mounting process of the semiconductor element in the method of manufacturing the semiconductor device according to the embodiment of the present disclosure.

In the method of manufacturing the semiconductor device, first, semiconductor element 6 with an adhesive layer shown in FIG. 3A is prepared. That is, on functional surface 6a on which bump 8 for external connection is formed, semiconductor element 6 with the adhesive layer provided film shape adhesive layer 9 including the flux components in a state where it covers bump 8 is prepared (first process). Bump 8 includes bump base portion 8a provided by being electrically connected with circuit electrode 6b formed on functional surface 6a and solder 8b formed on a tip end surface of bump base portion 8a.

Next, semiconductor element 6 of the above-described configuration is held by holding nozzle 13 (not shown) and semiconductor element 6 is moved above board 7 by moving bonding head 16 such that a bonding portion is positioned on board 7. That is, as shown in FIG. 3A, above board 7 including electrode 7a to which bump 8 is bonded, semiconductor element 6 with adhesive layer 9 is positioned in a state in which bump 8 and electrode 7a face each other (second process).

Next, the ultrasonic bonding process starts. That is, semiconductor element 6 held by holding nozzle 13 is lowered with respect to board 7. At a timing at which pressing mechanism 18 detects that adhesive layer 9 of semiconductor element 6 is brought into contact with electrode 7a of board 7, the lowering of semiconductor element 6 stops and the application of the ultrasonic vibration in this state starts. By holding this state for a predetermined period of time, the flux component of adhesive layer 9 in a portion sandwiched between bump 8 and electrode 7a is activated.

Figure 3B:
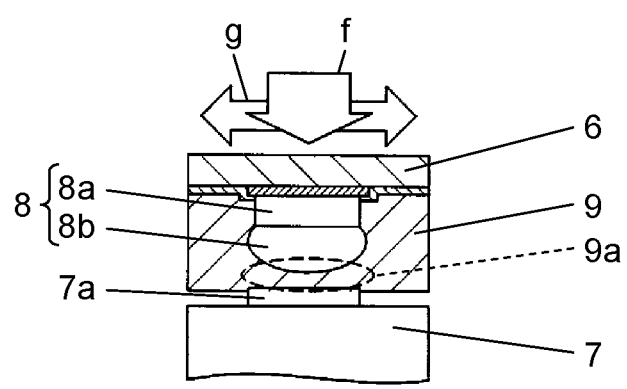
FIG. 3B is another process explanatory diagram of a mounting process of the semiconductor element in the method of manufacturing the semiconductor device according to the embodiment of the present disclosure.

That is, as shown in FIG. 3B, adhesive layer 9 is pressed against electrode 7a (arrow f), and the ultrasonic vibration is applied to semiconductor element 6 (arrow g). With this, the flux components included in adhesive layer 9 of the portion (activation target area 9a indicated by broken line) sandwiched between bump 8 and electrode 7a is activated (third process). By acting the activated flux components on joint surfaces in the ultrasonic bonding, that is, an upper surface of electrode 7a of board 7 and a lower surface of solder 8b forming bump 8, the oxide film present in these joint surfaces is reduced and removed.

The above-described activation of the flux components is presumed to be due to the following mechanism. That is, by acting the physical force of the ultrasonic vibration to adhesive layer 9 to the activation target area 9a via bump 8, the viscosity of adhesive layer 9 in activation target area 9a decreases. Therefore, adhesive layer 9 microscopically shows a behavior close to liquid phase. When the ultrasonic vibration acts to the liquid phase, a minute cavity is generated in adhesive layer 9 in activation target area 9a.

With this, the degree of contact of a reducing component such as organic acid contained in adhesive layer 9 with the joint surface via these cavities increases and as a result, the activation of the flux component is realized. In the activation of the flux components, since adhesive layer 9 as a whole is a film shape solid, even if the ultrasonic vibration acts before bump 8 of semiconductor element 6 is pressed against electrode 7a, a problem such as positional shift of semiconductor element 6 does not occur.

Figure 4A:
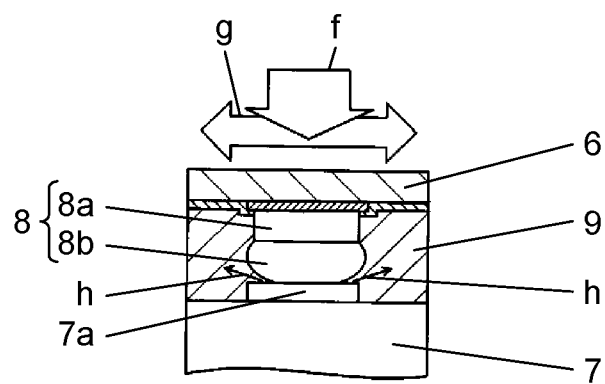
FIG. 4A is still another process explanatory diagram of a mounting process of the semiconductor element in the method of manufacturing the semiconductor device according to the embodiment of the present disclosure.

After activating the flux component of adhesive layer 9 in this manner, the ultrasonic bonding process proceeds. As shown in FIG. 4A, in this process, while applying the ultrasonic vibration to board 7 (arrow g), semiconductor element 6 is pressed against board 7 (arrow f). At this time, by lowering bump 8, the above-described joint surface, that is, adhesive layer 9 present between the upper surface of electrode 7a and the lower surface of solder 8b is excluded from a surface between the joint surfaces. With this, in a contact state of these joint surfaces, the oxide film is reduced and removed by the flux component, and the newly-formed metal surfaces are brought into contact with each other. That is, in a process shown in FIG. 4A, furthermore, semiconductor element 6 is pressed to board 7 while applying the ultrasonic vibration, and adhesive layer 9 including flux components is pushed out from a space between solder 8b of bump 8 and electrode 7a such that bump 8 and electrode 7a are brought into contact with each other (fourth process).

Figure 4B:
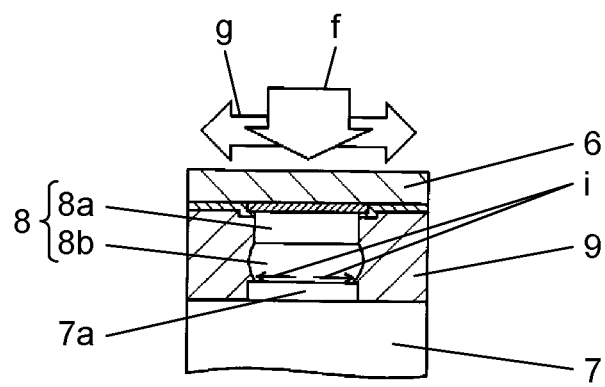
FIG. 4B is further still another process explanatory diagram of a mounting process of the semiconductor element in the method of manufacturing the semiconductor device according to the embodiment of the present disclosure.

In this state, the ultrasonic bonding process is continued. That is, as shown in FIG. 4B, the application of the ultrasonic vibration (arrow g) and the pressing of semiconductor element 6 (arrow f) are continued, and bump 8 is bonded to electrode 7a (fifth process). In this process, the upper surface of electrode 7a that is the joint surface and the lower surface of solder 8b configure a new metal surface in a state where the oxide film is removed. From this, it is possible to perform metal bonding excellent in bonding property with a short time (for example, one sec.) by the ultrasonic vibration (arrow i) acting on the joint surface.

In the metal junction by the ultrasonic vibration, since the newly formed metal surfaces are bonded to each other by the mechanical energy of the ultrasonic vibration without melting solder 8b of bump 8, it is not necessary to heat the junction portion to a temperature equal to or greater than a melting point of solder 8b in the bonding process. Therefore, it is possible to perform the entire bonding process in a temperature range (for example, 80° C. to 150° C.) lower than the melting point temperature of a metal part configuring the junction portion such as solder 8b and electrode 7a. Therefore, even in a case where a manufacturing target is a stacked type semiconductor device in which thin semiconductor elements are stacked and mounted, deformation due to heat of the semiconductor element can be suppressed as much as possible and good quality can be ensured.

Figure 5:
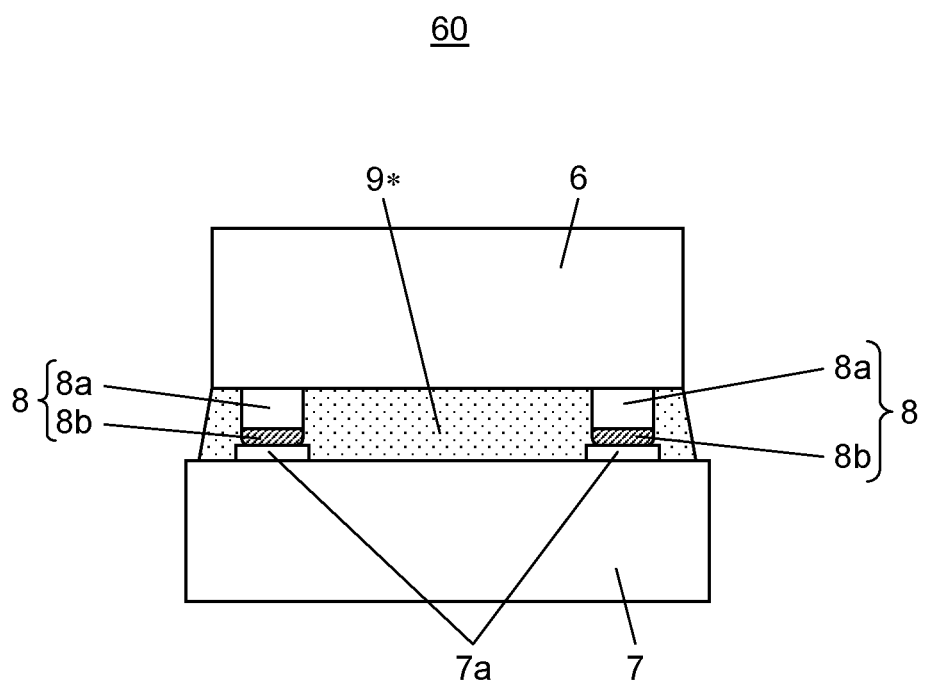
FIG. 5 is a sectional view of the semiconductor device manufactured by the method of manufacturing the semiconductor device according to the embodiment of the present disclosure.

After that, board 7 on which a predetermined number of each of semiconductor elements 6 are mounted by the ultrasonic bonding is sent to a curing device (sixth process). In the curing device, by holding board 7 for a predetermined period of time in a temperature atmosphere higher than a thermal curing temperature of the main agent (here, epoxy resin) configuring adhesive layer 9, adhesive layer 9 is thermally cured. With this, for each semiconductor element 6, a gap between board 7 and semiconductor element 6 is sealed, and a resin sealing portion 9* (see FIG. 5) for reinforcing by surrounding the junction portion between bump 8 and electrode 7a is formed. Next, after curing is finished, board 7 is sent to a dicing process, and, here, board 7 is divided for each individual semiconductor element 6. With this, as shown in FIG. 5, semiconductor device 60 in which bump 8 of semiconductor element 6 is bonded to electrode 7a of board 7, is completed.

As described above, in the method of manufacturing the semiconductor device indicated in this embodiment, as semiconductor element 6 mounted on board 7 by the ultrasonic bonding, on functional surface 6a on which bump 8 for external connection is formed, semiconductor element 6 with the adhesive layer provided in a state where film shape adhesive layer 9 including the flux components covers bump 8, is used. In the ultrasonic bonding process, by pressing adhesive layer 9 to electrode 7a and applying the ultrasonic vibration to semiconductor element 6, the flux component of the portion sandwiched between bump 8 and electrode 7a is activated.

It is possible to improve the act of removing the oxide film on the joint surface which is a contact portion between bump 8 and electrode 7a, and it is possible to bond bump 8 and electrode 7a by ultrasonic waves without melting solder 8b. With this, the bonding of bump 8 of semiconductor element 6 and electrode 7a of board 7 can be efficiently performed in the low temperature range.

In the above-described embodiment, a configuration is shown in which solder 8b as a bonding agent is formed at bump base portion 8a as bump 8 and only bump 8 has a solder for bonding, but the present disclosure is not limited to such a configuration. For example, a solder as the bonding agent may be formed on the upper surface of electrode 7a of the bonding target. Furthermore, a solder may be formed on both bump 8 and electrode 7a. In short, as long as solder is present on the surface of at least one of bump 8 and electrode 7a, it is subject to the present disclosure.

The method of manufacturing the semiconductor device of the present disclosure has an effect that it is possible to efficiently perform bonding of the bump and the electrode in the low temperature range and is useful in a manufacturing field of a semiconductor device in which the bump of the semiconductor element is bonded to the electrode of the board by improving the act of removing the oxide film in the contact portion between the bump of the semiconductor element and the electrode of the board.

What is claimed is:

1. A method of manufacturing a semiconductor device, comprising:
   a first step of preparing a semiconductor element including a functional surface on which a bump for external connection is formed and an adhesive layer of a film shape that covers the functional surface and a top surface of the bump, the adhesive layer including a flux component;
   a second step of positioning the semiconductor element in a state in which the bump and an electrode face each other above a board including the electrode to which the bump is bonded;
   a third step of activating the flux component of a portion of the adhesive layer sandwiched between the top surface of the bump and the electrode by pressing the adhesive layer against the electrode and applying ultrasonic vibration to the semiconductor element while the bump and the electrode are not in contact with each other;
   following the third step, a fourth step of pushing out the flux component from the portion of the adhesive layer that covers the top surface of the bump by pressing the semiconductor element while applying the ultrasonic vibration to the board, and bringing the bump into contact with the electrode; and
   a fifth step of bonding the bump to the electrode by continuing the application of the ultrasonic vibration and the pressing of the semiconductor element.

2. The method of manufacturing the semiconductor device of claim 1,
   wherein the adhesive layer includes a main agent made of a resin, a thermoplastic agent, a curing agent for curing the resin of the main agent, a curing accelerator for accelerating curing of the resin of the main agent, an organic acid, and a filler.

3. The method of manufacturing the semiconductor device of claim 1,
   wherein a solder is formed on a surface of at least one of the bump and the electrode.

* * * * *